(12) United States Patent
Han et al.

(10) Patent No.: US 10,510,743 B2
(45) Date of Patent: Dec. 17, 2019

(54) STEP FIN FIELD-EFFECT-TRANSISTOR (FINFET) WITH SLIM TOP OF FIN AND THICK BOTTOM OF FIN FOR ELECTRO-STATIC-DISCHARGE (ESD) OR ELECTRICAL OVER-STRESS (EOS) PROTECTION

(71) Applicant: Hong Kong Applied Science and Technology Research Institute Company, Limited, Hong Kong (HK)

(72) Inventors: Xiaoyong Han, Hong Kong (HK); Xiao Huo, Hong Kong (HK); Shuli Pan, Hong Kong (HK)

(73) Assignee: Hong Kong Applied Science and Technology Research Institute Company, Limited, Hong Kong (HK)

( * ) Notice: Subject to any disclaimer, the term of this patent is extended or adjusted under 35 U.S.C. 154(b) by 162 days.

(21) Appl. No.: 15/652,645

(22) Filed: Jul. 18, 2017

(65) Prior Publication Data
US 2019/0027470 A1   Jan. 24, 2019

(51) Int. Cl.
*H01L 29/78* (2006.01)
*H01L 27/02* (2006.01)
(Continued)

(52) U.S. Cl.
CPC ........ *H01L 27/0266* (2013.01); *H01L 21/265* (2013.01); *H01L 29/41791* (2013.01);
(Continued)

(58) Field of Classification Search
None
See application file for complete search history.

(56) References Cited

U.S. PATENT DOCUMENTS

| 7,964,893 B2 | 6/2011 | Lee |
| 8,735,993 B2 | 5/2014 | Lo et al. |

(Continued)

FOREIGN PATENT DOCUMENTS

| CN | 101236995 A | 8/2008 |
| CN | 101303975 A | 11/2008 |

(Continued)

OTHER PUBLICATIONS

ISR and Written Opinion, PCT/CN2017/094528, dated Apr. 27, 2018.

*Primary Examiner* — Joseph C. Nicely
*Assistant Examiner* — Lamont B Koo
(74) *Attorney, Agent, or Firm* — Stuart T. Auvinen; g Patent LLC

(57) ABSTRACT

An Electro-Static-Discharge (ESD) protection device has a Fin Field-Effect Transistor (FinFET) with a silicon fin with a step separating a top fin and a bottom fin. The gate wraps around the top fin but not the bottom fin. Normal gate-controlled channel conduction occurs in the top fin between a source and a drain in the top fin. Underneath the conducting channel is a buried conducting region in the bottom fin that conducts after a breakdown voltage is reached during ESD. A ledge, abrupt slope change in the sidewalls of the fin, or a doping increase occurs at the step between the top fin and bottom fin. The bottom fin is 2-3 times wider than the top fin, causing the resistance of the buried conducting region to be 2-3 times less than the resistance of the conducting channel, steering breakdown current away from the channel, reducing failures during breakdown.

9 Claims, 16 Drawing Sheets

(51) Int. Cl.
*H01L 21/265* (2006.01)
*H01L 29/417* (2006.01)
*H01L 29/423* (2006.01)

(52) U.S. Cl.
CPC ...... *H01L 29/42356* (2013.01); *H01L 29/785* (2013.01); *H01L 2029/7858* (2013.01)

(56) References Cited

U.S. PATENT DOCUMENTS

| | | |
|---|---|---|
| 9,305,916 B1 | 4/2016 | Cai et al. |
| 9,455,316 B2 | 9/2016 | Singh et al. |
| 9,478,618 B1 | 10/2016 | Park |
| 9,583,623 B2 | 2/2017 | Fung et al. |
| 2015/0311342 A1 | 10/2015 | Lin et al. |
| 2015/0348958 A1* | 12/2015 | Bu ...................... H01L 27/0266 257/347 |

FOREIGN PATENT DOCUMENTS

| | | |
|---|---|---|
| CN | 103227202 A | 7/2013 |
| CN | 103579002 A | 2/2014 |
| CN | 106328692 A | 1/2017 |

\* cited by examiner

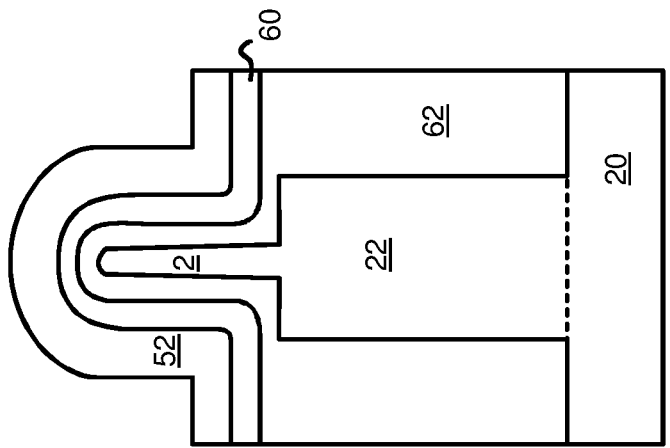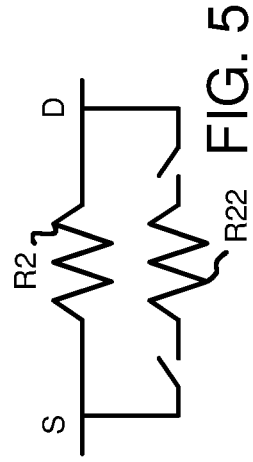
FIG. 4
FIG. 5
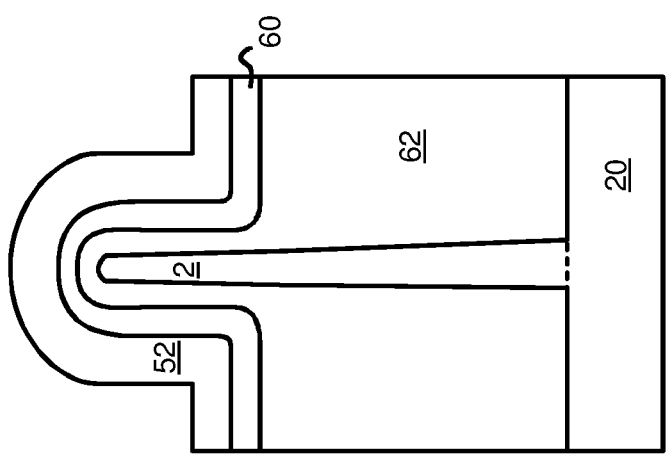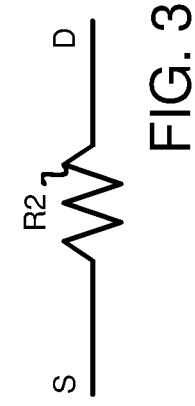
FIG. 2
PRIOR ART
FIG. 3

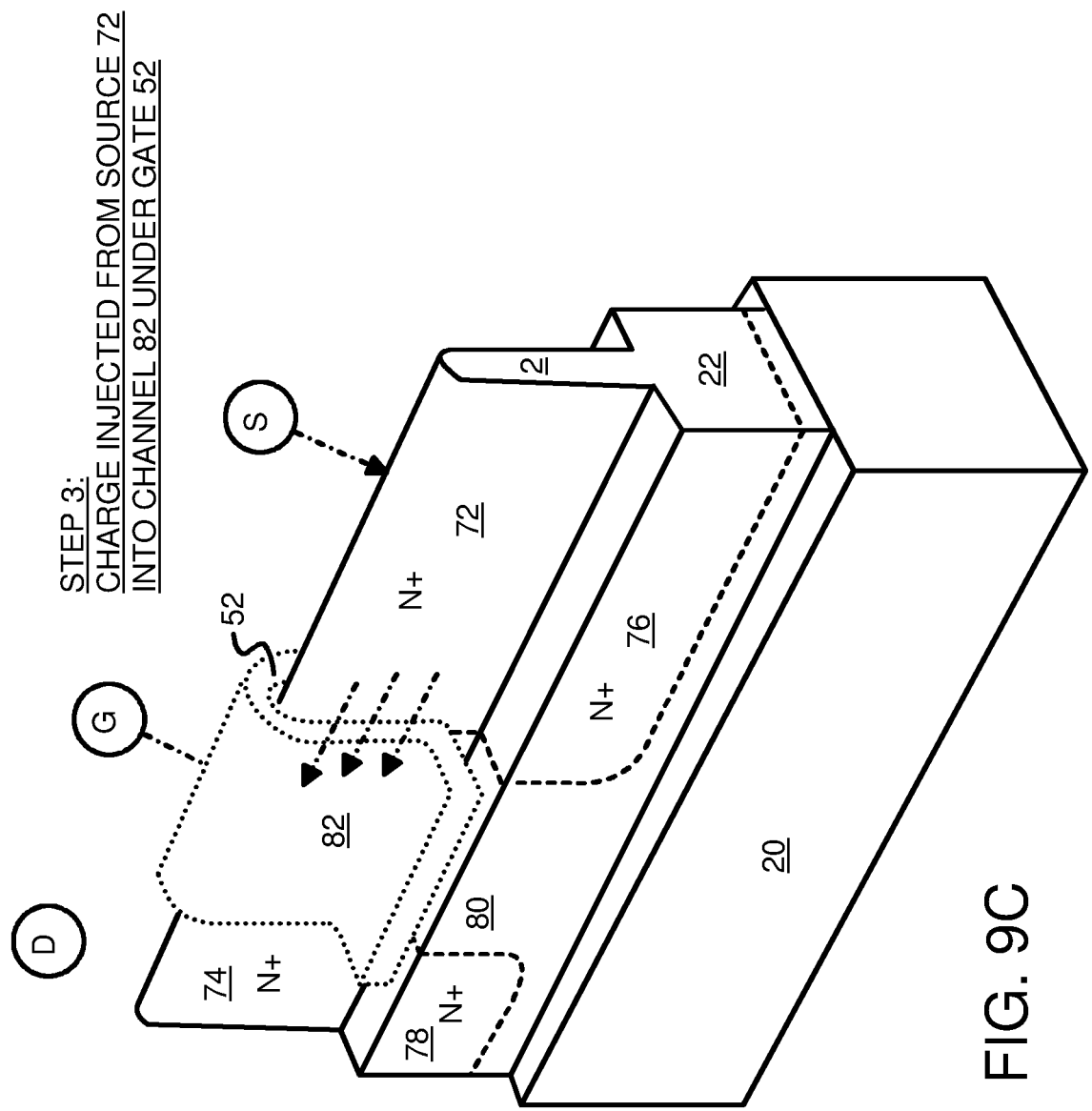

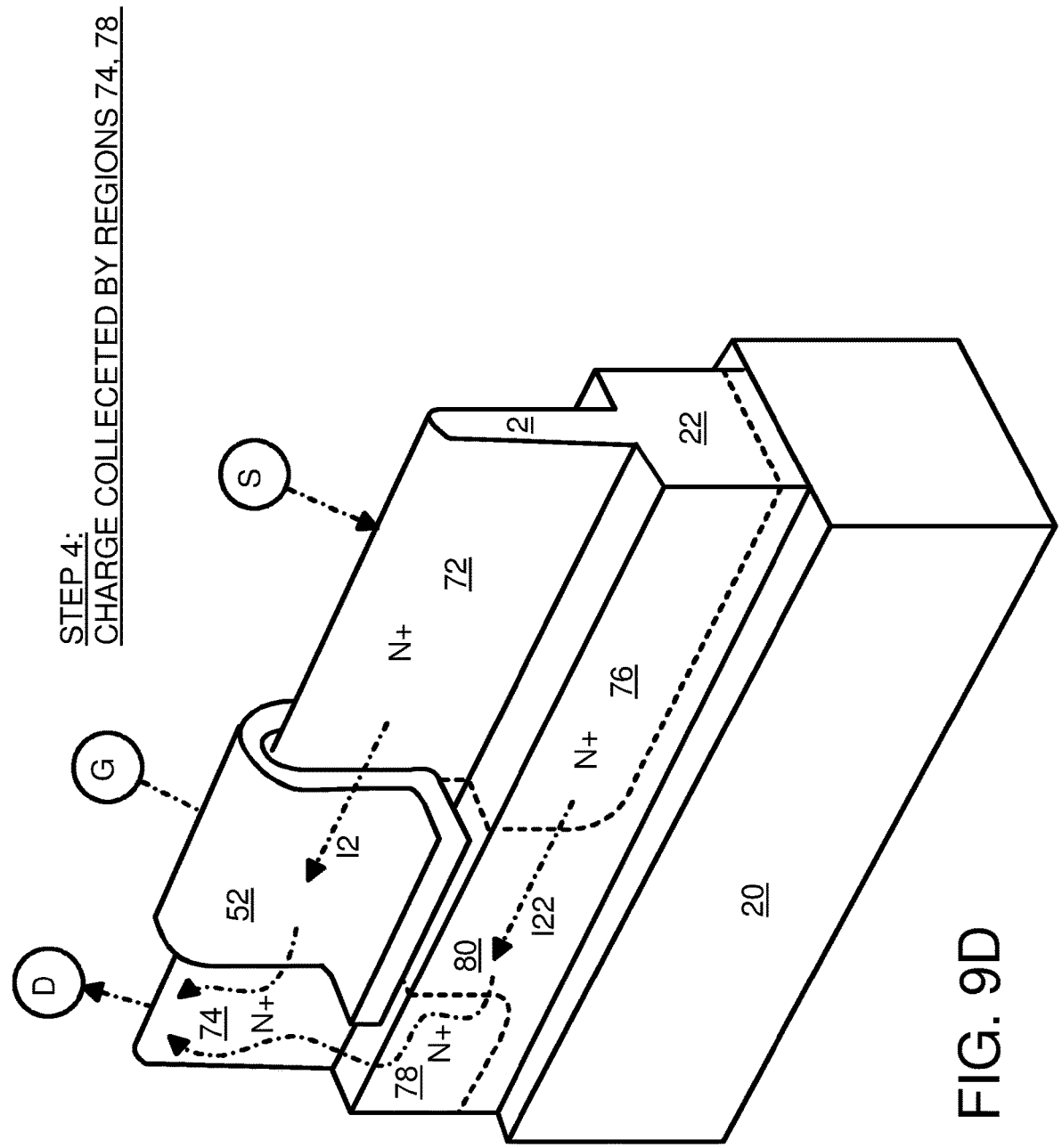

STEP FIN FIELD-EFFECT-TRANSISTOR (FINFET) WITH SLIM TOP OF FIN AND THICK BOTTOM OF FIN FOR ELECTRO-STATIC-DISCHARGE (ESD) OR ELECTRICAL OVER-STRESS (EOS) PROTECTION

FIELD OF THE INVENTION

This invention relates to Electro-Static-Discharge (ESD) and Electrical-Over-Stress (EOS) protection circuits, and more particularly to ESD/EOS protection circuits using a Fin Field-Effect Transistor (FinFET) that is enhanced for better ESD protection.

BACKGROUND OF THE INVENTION

Higher speed semiconductor devices may be attained by shrinking sizes and reducing parasitic capacitances. A typical Metal-Oxide-Semiconductor Field-Effect Transistor (MOSFET) transistor is fabricated on a silicon substrate or within a well in the substrate, and has a large parasitic capacitance to this substrate or well.

However, the extremely tiny transistors have a thin gate oxide that can be damaged by relatively small currents with even a moderate driving force (voltage). Special care is required when a human handles these semiconductor devices.

Static electricity that normally builds up on a person can discharge across any pair of pins of a semiconductor integrated circuit (IC or chip). IC chips are routinely tested for resistance to such electrostatic discharges (ESD) using automated testers that apply a Human-Body Model (HBM) current pulse across different pairs of pins of the chip. Any pair of pins may be chosen for the ESD test.

More recently, planar MOSFET devices are being replaced by FinFET. FinFET uses a more three-dimensional transistor structure where the transistor gate is no longer within one single plane. FinFET uses a smaller area and tend to have smaller leakages than traditional planar transistors.

FIG. 1 shows a prior-art FinFET device. N+ regions 42, 44 are formed on the upper portion of the fin formed on substrate 20. The lower portion of the fin without N+ doping is surrounded by oxide 62. Substrate 20 can be a silicon substrate or an insulator for Silicon-On-Insulator (SOI) processes. N+ regions 42, 44 are very thin, having a slim, fin-like appearance. Between N+ region 42 and N+ region 44 is a connecting region of lightly-p-doped silicon that acts as the transistor channel. N+ region 42, the channel connecting region, and N+ region 44 can all be formed on the same fin of silicon.

Gate 52 is formed around the channel connecting region. Rather than being flat, gate 52 has an inverted U-shape that surrounds the channel connecting region between N+ regions 42, 44. Gate oxide 60 is formed on three sides of the fin-like channel connecting region rather than only on the top surface of the channel region.

FinFET transistors may have better current drive than equivalent flat transistors for the same die area due to this 3-D gate and channel structure. However, when a FinFET transistor is used for ESD protection, the high ESD currents can damage the FinFET transistor. In particular, extreme heating is sometimes seen in N+ region 42 near the junction to the channel region under gate 52. This extreme heating when a large ESD current passes through N+ region 42 can permanently damage gate oxide 60 and N+ region 42, causing the device to leak or malfunction.

Also, the thin or slim size of the fin used for N+ region 42 causes the current to be crowded into a narrow region, causing localized hot spots. Heat dissipation is hindered by the slim fin of N+ region 42 that is typically surrounded by an insulator including oxide 62 and a passivation insulator that covers everything, including N+ region 42, oxide 62, and gate 52.

FIG. 2 is a cross-section of the prior-art slim FinFET of FIG. 1. Slim fin 2 may be formed on substrate 20 to have a slim profile. Slim fin 2 is surrounded by oxide 62 which may form part of the gate oxide 60 between fin 2 and gate 52. A conducting channel is temporarily formed within slim fin 2 underneath gate 52 when a voltage is applied to gate 52 that is above the threshold voltage. This conducting channel allows current to flow from N+ region 42 to N+ region 44 through the p-type channel connecting region of slim fin 2 shown in FIG. 2.

During ESD testing, gate 52 is connected to ground for a Grounded-Gate NMOS device, so very little or no current is conducted through the p-type region of slim fin 2 that is not underneath gate 52 since no conducting channel is formed farther away from gate 52. However, when large ESD currents are applied, punch-through breakdown can occur where conduction may occur in the upper portion of slim fin 2, even farther below gate 52, not just in the conducting channel formed by the electric charge on gate 52.

FIG. 3 is an electrical schematic model of the FinFET of FIG. 2. The slim profile of the cross-section of slim fin 2 causes the gate conducting channel to have a relatively high resistance R2 between the source N+ region 42 and drain N+ region 44 (FIG. 1), when snap-back or punch-through breakdown occurs in the upper portion of slim fin 2.

One solution is to use a thicker profile for slim fin 2. A thicker or wider profile for slim fin 2 would allow for a larger ESD current to pass through, but the performance during normal operation might suffer since the fin under gate 52 would also be thicker. Thick fins could be used only for ESD devices, while more optimal thin fins are used for core transistors, but the process would be more complex and expensive since two different thicknesses of FinFET transistors are formed.

What is desired is a FinFET that is optimized for normal operation, yet is also designed to carry large ESD currents. A FinFET that can safely carry larger ESD currents while still using a slim fin for optimal transistor characteristics for normal operating currents is desirable. A hybrid FinFET transistor that is optimized for both regular operation and for ESD protection is desirable.

BRIEF DESCRIPTION OF THE DRAWINGS

FIG. 2 is a cross-section of the prior-art slim FinFET of FIG. 1.

FIG. 3 is an electrical schematic model of the FinFET of FIG. 2.

FIG. 4 shows a FinFET transistor with a hybrid or step fin.

FIG. 5 is an electrical schematic model of the FinFET of FIG. 4.

FIGS. 9A-D highlight operation of the step FinFET during an ESD event.

DETAILED DESCRIPTION

Figure 1:
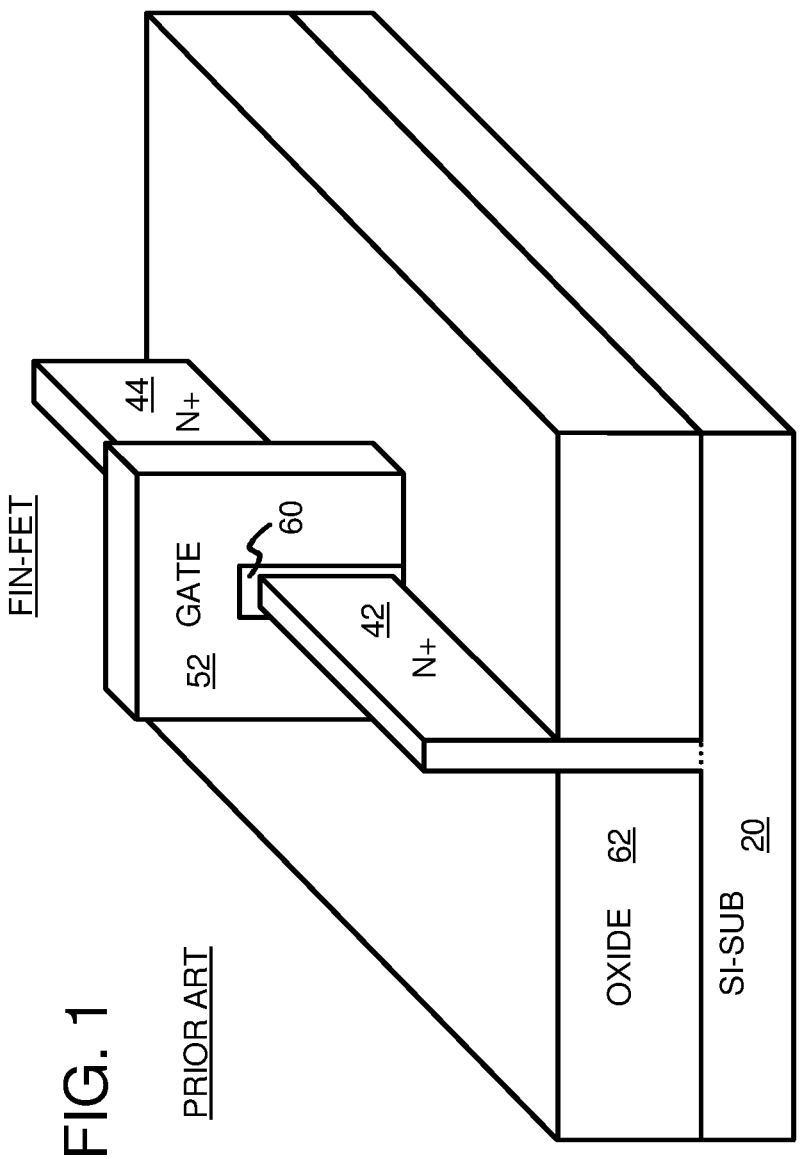
FIG. 1 shows a prior-art FinFET device.

The present invention relates to an improvement in FinFET ESD/EOS protection devices. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

FIG. 4 shows a FinFET transistor with a hybrid or step fin. The fin formed on substrate 20 has a wider bottom fin 22 and a narrow top slim fin 2. The fin has a slim profile near gate 52, allowing the transistor characteristics during normal operation to be optimal. However, the fin's width is increased below the area where gate 52 wraps around top slim fin 2. The fin's cross-sectional width or thickness steps from a small thickness for top slim fin 2 to a larger thickness for bottom fin 22. This step occurs just under the bottom of gate 52, although the exact location of the step could vary with different embodiments.

Top slim fin 2 and bottom fin 22 may be formed on substrate 20 by epitaxial growth, etching of a thicker substrate 20, deposition, or any combination of methods. Substrate 20 may be a silicon substrate or may be an insulator for Silicon-On-Insulator (SOI) processes. Gate oxide 60 may be an oxide such as hafnium oxide ($HfO_2$), and may be a composite of several layers, such as a layer of $HfO_2$ formed over a layer of silicon dioxide $SiO_2$, or various other advanced gate oxides. The exact cross-sectional profiles may vary from the idealized and simplified cross-sections shown in the drawings.

Figure 7:
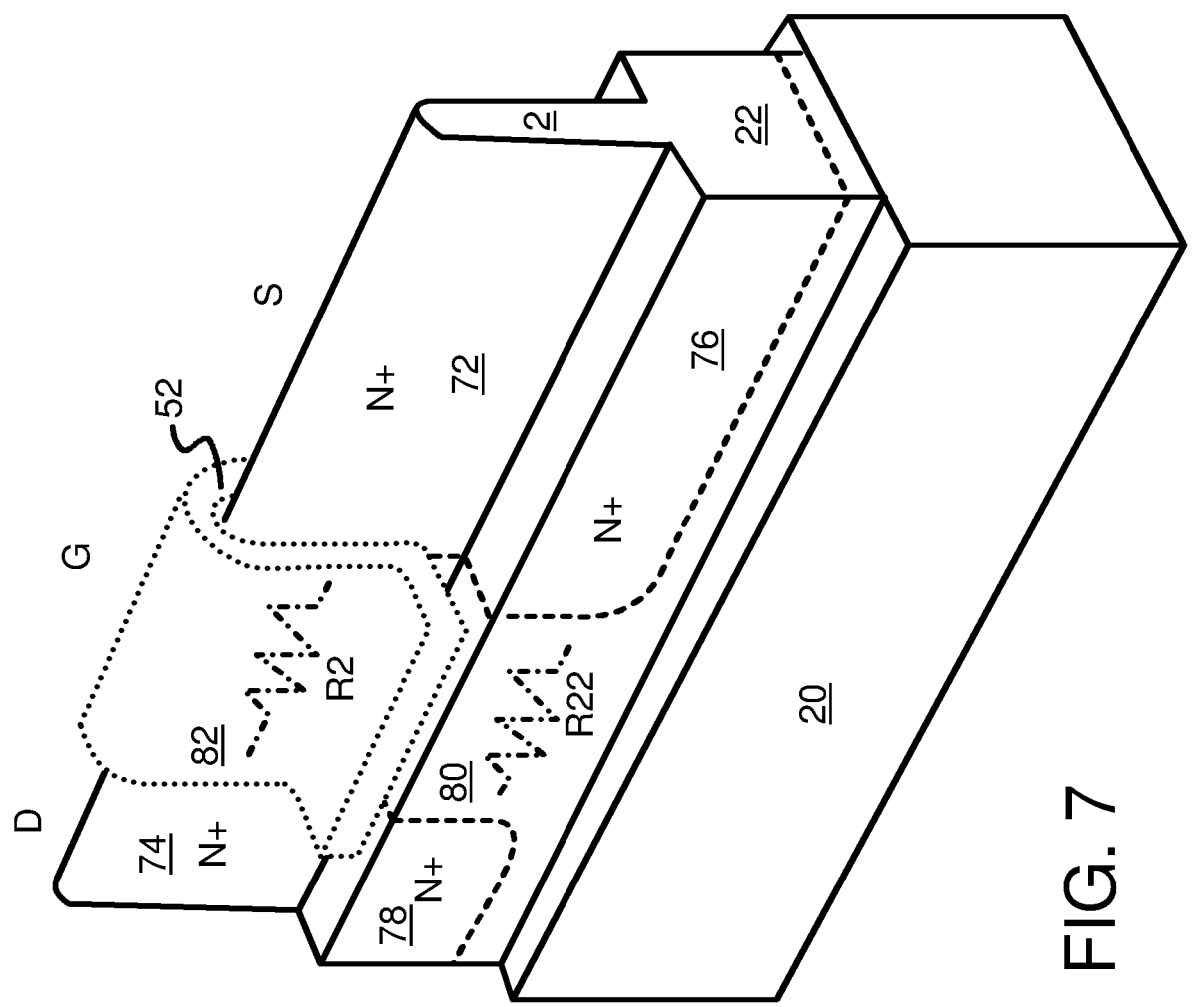
FIG. 7 is a view of the step FinFET highlighting the electrical properties of the top slim fin and the bottom fin underneath the gate.

FIG. 5 is an electrical schematic model of the FinFET of FIG. 4. The slim profile of the cross-section of top slim fin 2 causes the gate conducting channel to have a relatively high resistance R2 between the source N+ region 72 and drain N+ region 74 (FIG. 7). Even if the channel is not formed, such as during an ESD test, punch-through conduction in top slim fin 2 is relatively small with a resistance shown as R2. The resistance values R2 for normal channel conduction and for punch-through breakdown are different, and may vary with applied voltage, but are shown as a single value R2 for simplicity.

However, when snap-back or punch-through breakdown occurs, the switches in FIG. 5 close and bottom fin 22 (resistor R22) is available for use for conduction of larger ESD currents. Since bottom fin 22 is thicker than top slim fin 2, more current can be carried by the wider cross-section of bottom fin 22 than by top slim fin 2. Thus the resistance R22 of bottom fin 22 is lower than the resistance R2 of top slim fin 2. When bottom fin 22 has about three times the cross-sectional area of top slim fin 2, then R2 should be about three times greater than R22. The lower resistance of R22 causes more of the ESD current to be shunted through R22 and bottom fin 22 and less ESD current flows through R2 and top slim fin 2.

Figure 6:
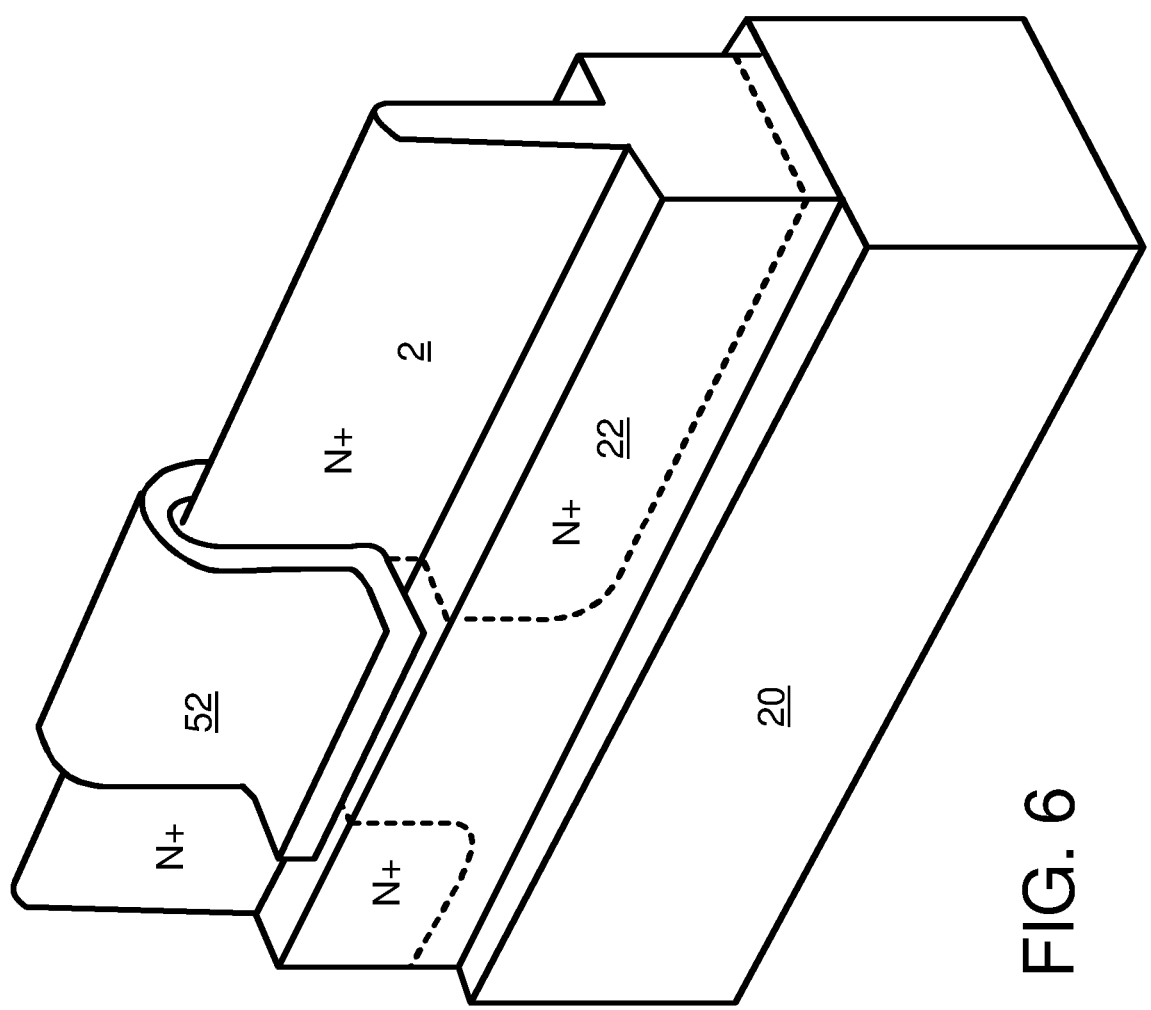
FIG. 6 is a perspective view of a step FinFET that has a thicker bottom fin and a top slim fin, and a deeper N+ Source/Drain implant.

FIG. 6 is a perspective view of a step FinFET that has a thicker bottom fin and a top slim fin, and a deeper Source/Drain implant. A fin is formed on substrate 20. This fin has a thicker bottom fin 22 and a thinner top slim fin 2 that are formed together as a single fin structure. The fin is made of silicon with a relatively light p-type doping. Then gate 52 is formed over a middle portion of the fin, with a gate oxide having been formed between gate 52 and the fin. Gate 52 is wrapped around the middle portion of top slim fin 2, but is not formed along the sides of bottom fin 22.

Once gate 52 is formed, ion implantation may be used to implant n-type dopant ions into top slim fin 2 to form N+ regions for the source and drain adjacent to gate 52. When the energy of the ion implantation is sufficiently high, implanted ions may reach bottom fin 22 to form N+ regions in bottom fin 22 as well as in top slim fin 2. Alternately, lower-energy ions may be implanted into top slim fin 2 and then diffused into bottom fin 22 to form the N+ regions in both top slim fin 2 and bottom fin 22. This deeper-than-normal N+ implant can improve hybrid device characteristics.

The n-type ions implanted are blocked by gate 52 so that they do not reach the middle portion of top slim fin 2 under gate 52. Thus the middle region under gate 52 remains p-type and can be used for form a conducting channel during normal MOS transistor operation.

Gate 52 is flared out at the bottom to cover the exposed step of bottom fin 22. This flaring of the bottom end of gate 52 blocks ion implantation into bottom fin 22 underneath gate 52. The flared end of gate 52 acts to shade the middle region in bottom fin 22 during ion implantation.

Thus gate 52 blocks n-type ions from being implanted into the middle region of bottom fin 22. The middle region of bottom fin 22 between the N+ source/drain regions remains p-type.

FIG. 7 is a view of the step FinFET highlighting the electrical properties of the top slim fin and the bottom fin underneath the gate. N-type ion implantation forms source N+ region 72 in top slim fin 2 and source N+ region 76 in bottom fin 22 on one side of gate 52, and also forms drain N+ region 74 in top slim fin 2 and drain N+ region 78 in bottom fin 22 on the other side of gate 52.

Since gate 52 blocks n-type ions, the middle region of top slim fin 2 underneath gate 52 remains p-type. This is conducting region 82. Conducting region 82 has a resistance of R2 between source N+ region 72 and drain N+ region 74 during an ESD event.

Gate 52 is flared out at the bottom to cover the exposed step of bottom fin 22. This flaring of the bottom end of gate 52 blocks ion implantation into buried conducting region 80. The flared end of gate 52 acts to shade buried conducting region 80 in bottom fin 22 during ion implantation.

Since gate 52 blocks n-type ions, the middle region of bottom fin 22 underneath gate 52 remains p-type. This is buried conducting region 80. Buried conducting region 80 has a resistance of R22 between source N+ region 76 and drain N+ region 78 during an ESD event.

Since bottom fin 22 is about three times thicker than top slim fin 2, the value of R2 is about three times than value of R22. During an ESD event, ESD current is shunted through R22 and buried conducting region 80 and away from higher resistance R2 and conducting region 82.

Figure 8:
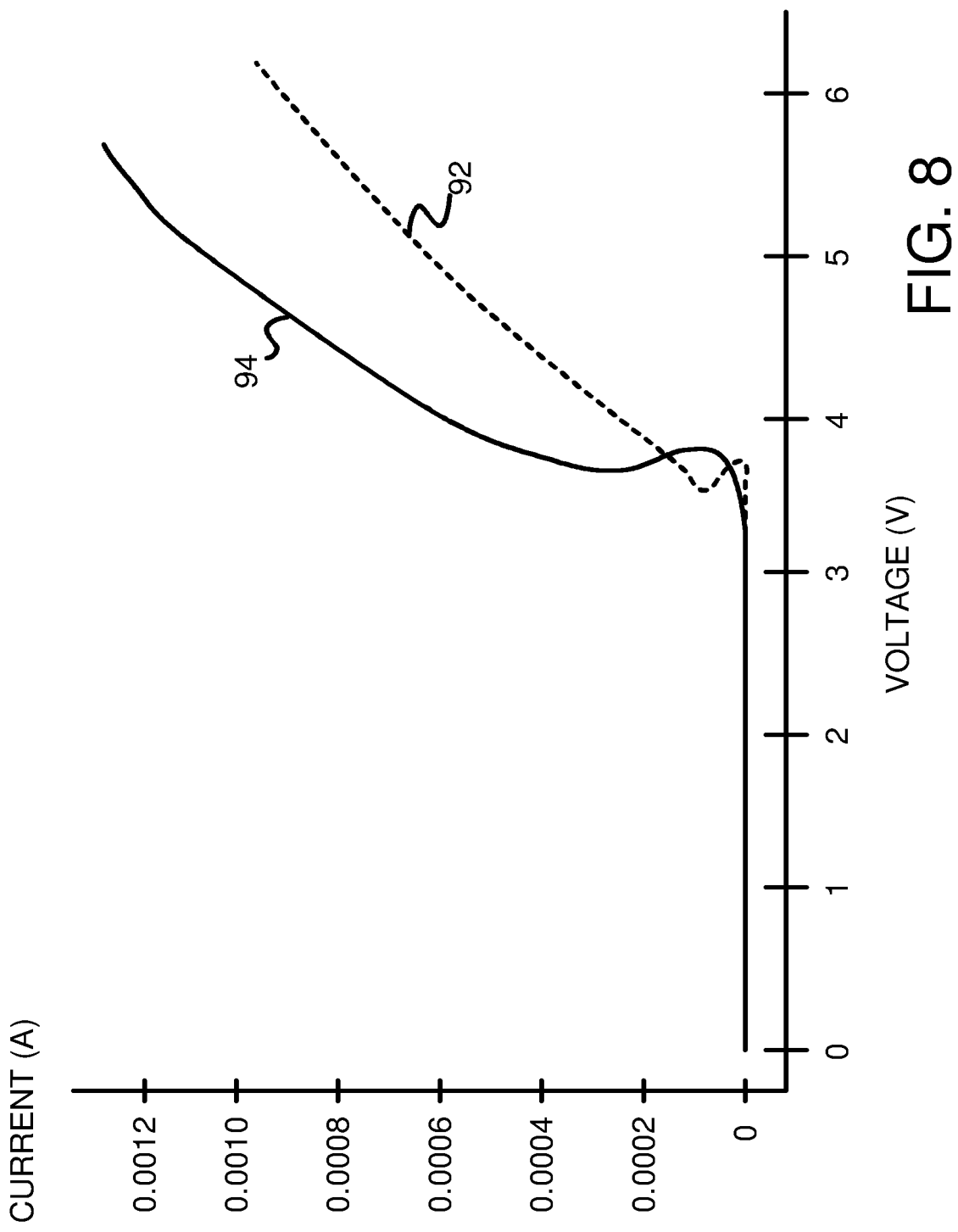
FIG. 8 is a graph of current and voltage of a standard FinFET and of the step FinFET.

FIG. 8 is a graph of current and voltage of a standard FinFET and of the step FinFET. Curve 92 shows the prior-art FinFET of FIG. 2 where the ESD current goes through only slim fin 2. Punch-through breakdown occurs at about 3.7 volts. The slope of curve 92 after breakdown is resistance R2.

Curve 94 shows the step FinFET of FIGS. 4-7 where the ESD current goes through both slim fin 2 and bottom fin 22. Punch-through breakdown occurs at about 3.8 volts. The slope of curve 94 after breakdown is parallel combination of resistance R2 and resistance R22. The lower parallel resistance of R2 and R22 has a steeper slope, allowing more current to flow for any voltage after breakdown. This higher current flow can more quickly dissipate and ESD pulse. The current is spread out over a larger cross-sectional area of bottom fin 22, reducing localized heating. Damage and failures are less likely.

Figure 9A:
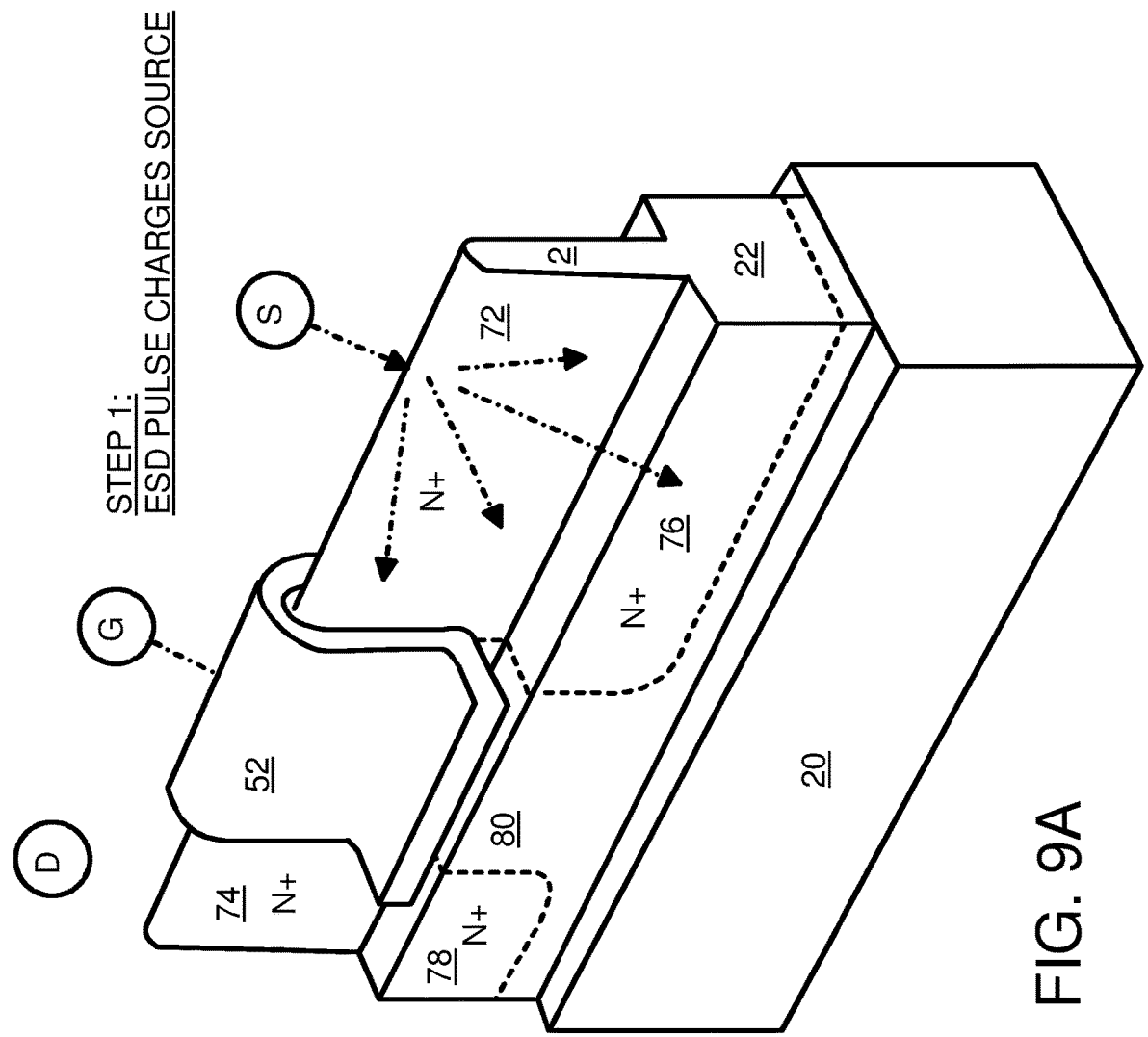

FIGS. 9A-D highlight operation of the step FinFET during an ESD event. During the ESD event, a negative ESD pulse is applied to source terminal S relative to drain terminal D. In FIG. 9A, negative carriers (electrons) from the ESD pulse flow into source N+ region 72 and then to source N+ region 76. Regions 72, 76 become negatively charged.

Figure 9B:
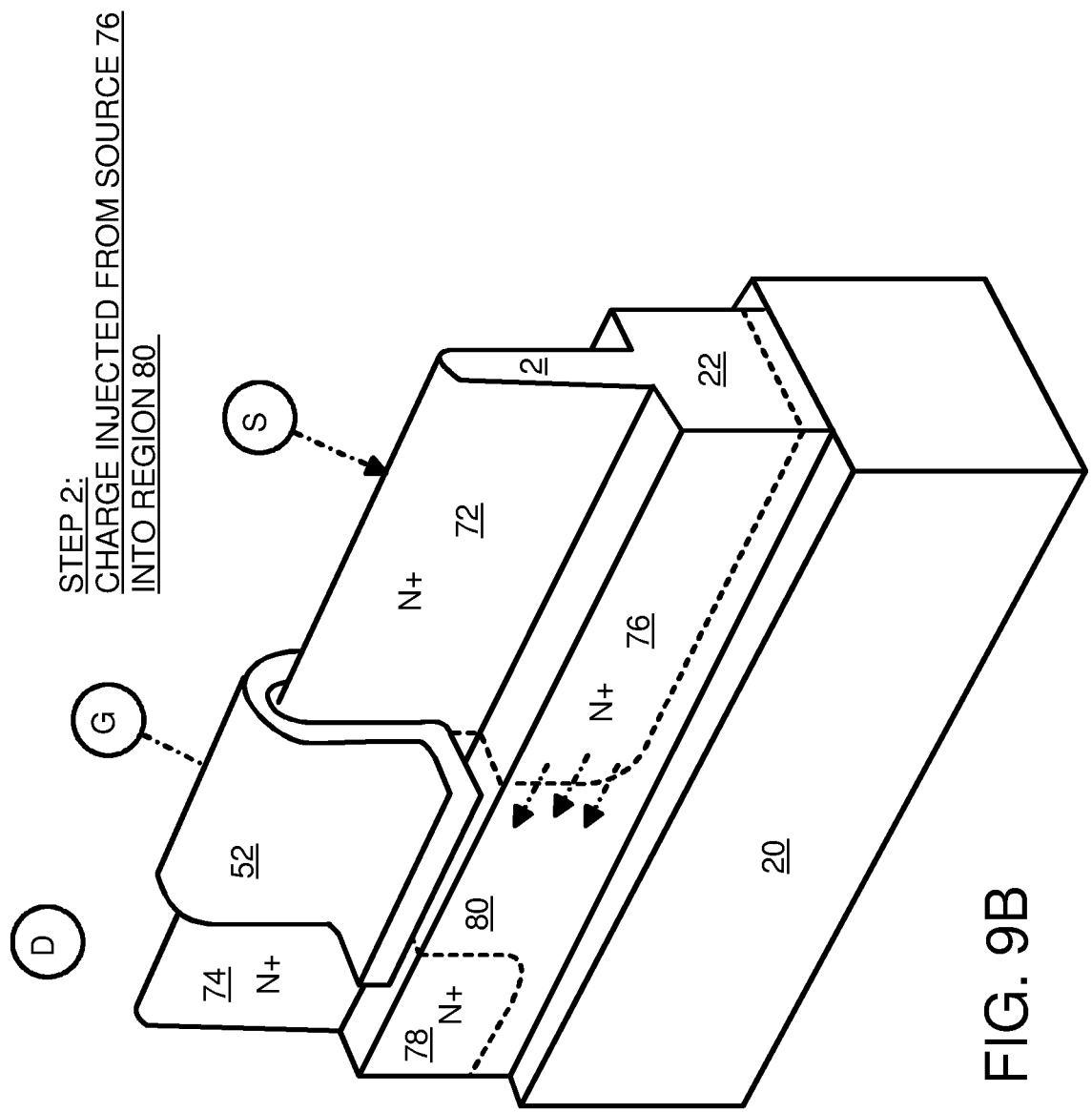

In FIG. 9B, the p-n junction in bottom fin 22 between source N+ region 76 and p-type buried conducting region 80 becomes forward biased, and electrons from source N+ region 76 are injected into buried conducting region 80.

In FIG. 9C, the p-n junction in top slim fin 2 between source N+ region 72 and conducting region 82 also becomes forward biased, and electrons from source N+ region 74 are injected into conducting region 82 underneath gate 52. An n-type conducting channel may or may not have formed under gate 52, depending on the voltage of gate 52 during the ESD event.

In FIG. 9D, the electrons injected into conducting region 82 (not shown in FIG. 9D, underneath gate 52) are collected by drain N+ region 74. This is current I2 in top slim fin 2. Also, electrons that were injected into buried conducting region 80 are collected by drain N+ region 78. This is current I22 in buried conducting region 80. The collected electrons flow out the drain contact to the second terminal of the ESD event.

Since bottom fin 22 is thicker than top slim fin 2, the current I22 through buried conducting region 80 in bottom fin 22 is larger than the current I2 through conducting region 82 in top slim fin 2. The localized heating along the source to channel boundary is spread out over a larger area, reducing potential damage.

Also, more of the ESD current flows as current I22 than as current I2, reducing heating at the tip of top slim fin 2. Heat generated in bottom fin 22 can more easily thermally conduct to substrate 20, while heat generated in top slim fin 2 is farther away from substrate 20 and is surrounded by electrical insulators, which also tend to act as thermal insulators.

Figure 10:
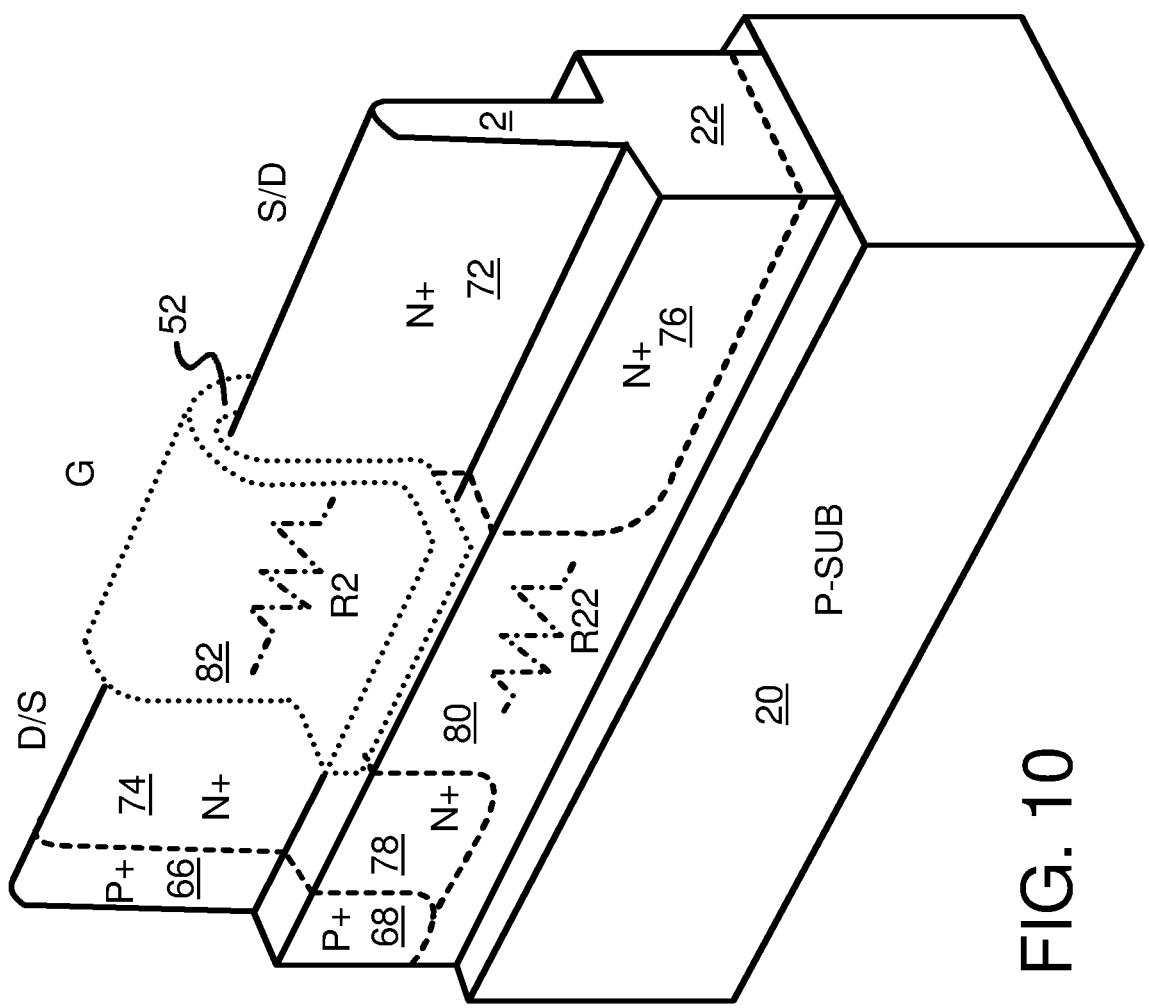
FIG. 10 shows a hybrid FinFET with a body contact.

FIG. 10 shows a hybrid FinFET with a body contact. A mask is applied that allows a p-type implant to form P+ tap region 66 at the end of drain N+ region 74. This may be a deep implant so that the high p-type doping reaches into bottom fin 22 to form P+ deep tap region 68. When a supply voltage such as ground is applied to P+ tap region 66, P-type substrate 20 is grounded through P+ deep tap region 68. Since buried conducting region 80 and conducting region 82 are also p-type, they are also biased to ground through substrate 20 and P+ tap region 66. Thus P+ tap region 66 is the substrate or body bias terminal for the n-channel transistor having other terminals of gate 52, N+ region 72, and N+ region 74.

A single metal contact (not shown) may be made to both P+ tap region 66 and to drain N+ region 74. During normal operation, ground can be applied to both P+ tap region 66 and to drain N+ region 74. During normal operation, drain N+ region 74 acts as the source, while source N+ region 72 acts as the drain.

However, for a negative ESD pulse test, P+ tap region 66 and drain N+ region 74 are grounded, but source N+ region 72 receives a negative ESD pulse below ground. For this negative ESD test, drain N+ region 74 acts as the drain, and source N+ region 72 acts as the source. The terms source and drain are interchangeable since they depend on the applied bias voltages.

Figure 11B:
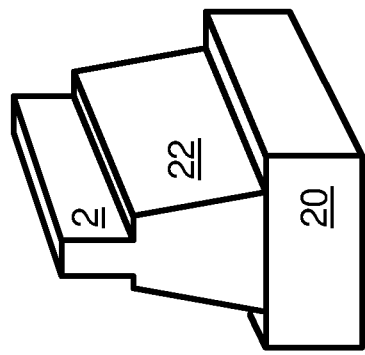
FIGS. 11A-D show alternative fin shapes that have a profile step.
Figure 11D:
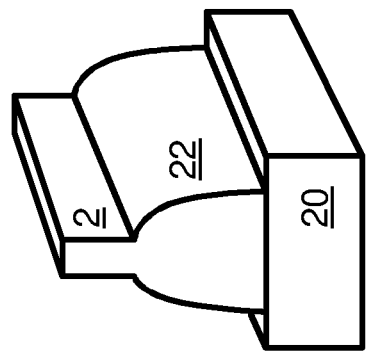
Figure 11A:
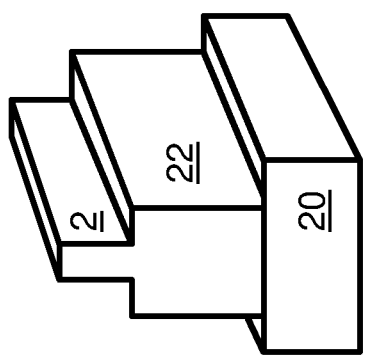

FIGS. 11A-D show alternative fin shapes that have a profile step. In FIG. 11A, the fin has a rectangular shape with a horizontal or near-horizontal step between top slim fin 2 and bottom fin 22. Substrate 20 may be etched first to create top slim fin 2, then with a wider mask opening to create bottom fin 22. Alternately, epitaxial growth or deposition on substrate 20 first creates bottom fin 22, then creates top slim fin 2. As another alternative, an epitaxial layer may first be grown on substrate 20, and then etched to form bottom fin 22 and top slim fin 2.

FIG. 11B shows a trapezoidal fin shape. Rather than have vertical side walls, in this embodiment bottom fin 22 has sloped walls. The cross-section of bottom fin 22 is a trapezoid. Specialized etching or growth techniques may be used to produce the various fin shapes in FIGS. 11B-D.

Figure 11C:
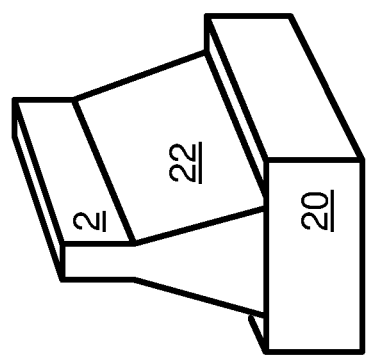

FIG. 11C shows a triangular fin shape. Bottom fin 22 again has slanted side walls, but there is no horizontal step at the top of bottom fin 22. Instead, the side walls of bottom fin 22 directly connect to top slim fin 2 with no horizontal ledge.

FIG. 11D shows a bottom fin with curved side walls. Rather than have flat, planar side walls, bottom fin 22 has curved side walls. The slope of the side walls has a convex shape as shown in FIG. 11D, but more complex shapes may be used. Also, processing may vary the shape from an ideal, such as shown in FIG. 11A. Doping profiles may also vary from the ideals shown and may be affected by the fin shape.

Figure 12:
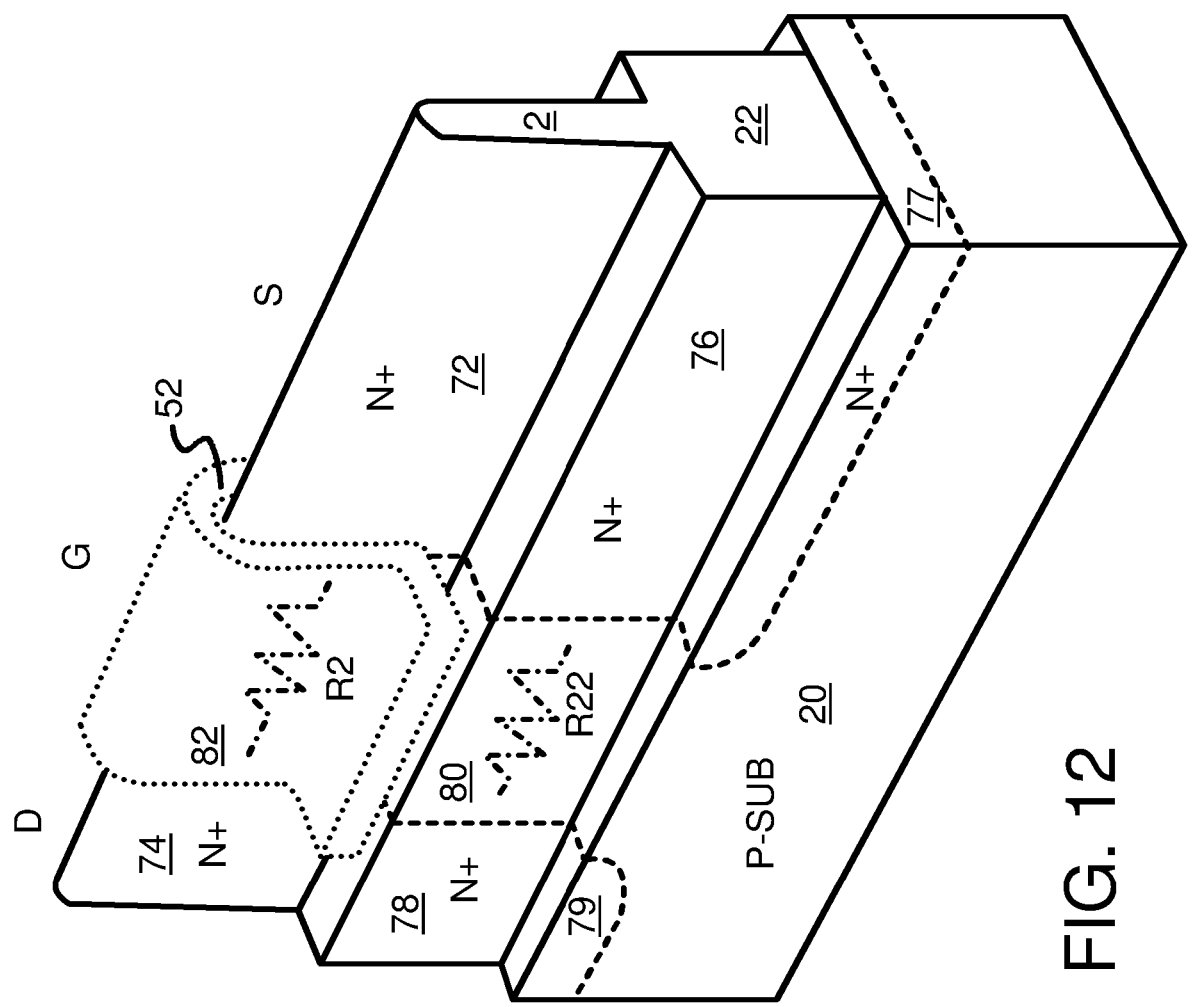
FIG. 12 is a variation of the dual-use FinFET where the source/drain implant reaches deeper into the substrate.

FIG. 12 is a variation of the dual-use FinFET where the source/drain implant reaches deeper into the substrate. The p-type ion implant creates source N+ region 72 and source N+ region 76, but some dopant reaches into substrate 20 to form deep source N+ region 77 underneath source N+ region 76. The ion implantation energy may be high, or some dopant may diffuse into substrate 20.

Likewise, deep drain N+ region 79 may form in substrate 20 underneath drain N+ region 78. This deeper source/drain implant may further reduce the resistance of R22 for buried conducting region 80 deep under gate 52, since the deeper N+ regions may allow for a larger cross-sectional area for current to flow during an ESD event when punch-through occurs and deep conduction uses resistor R22. However, the larger source/drain area may increase parasitic capacitances for the FinFET during normal operation.

Figure 13:
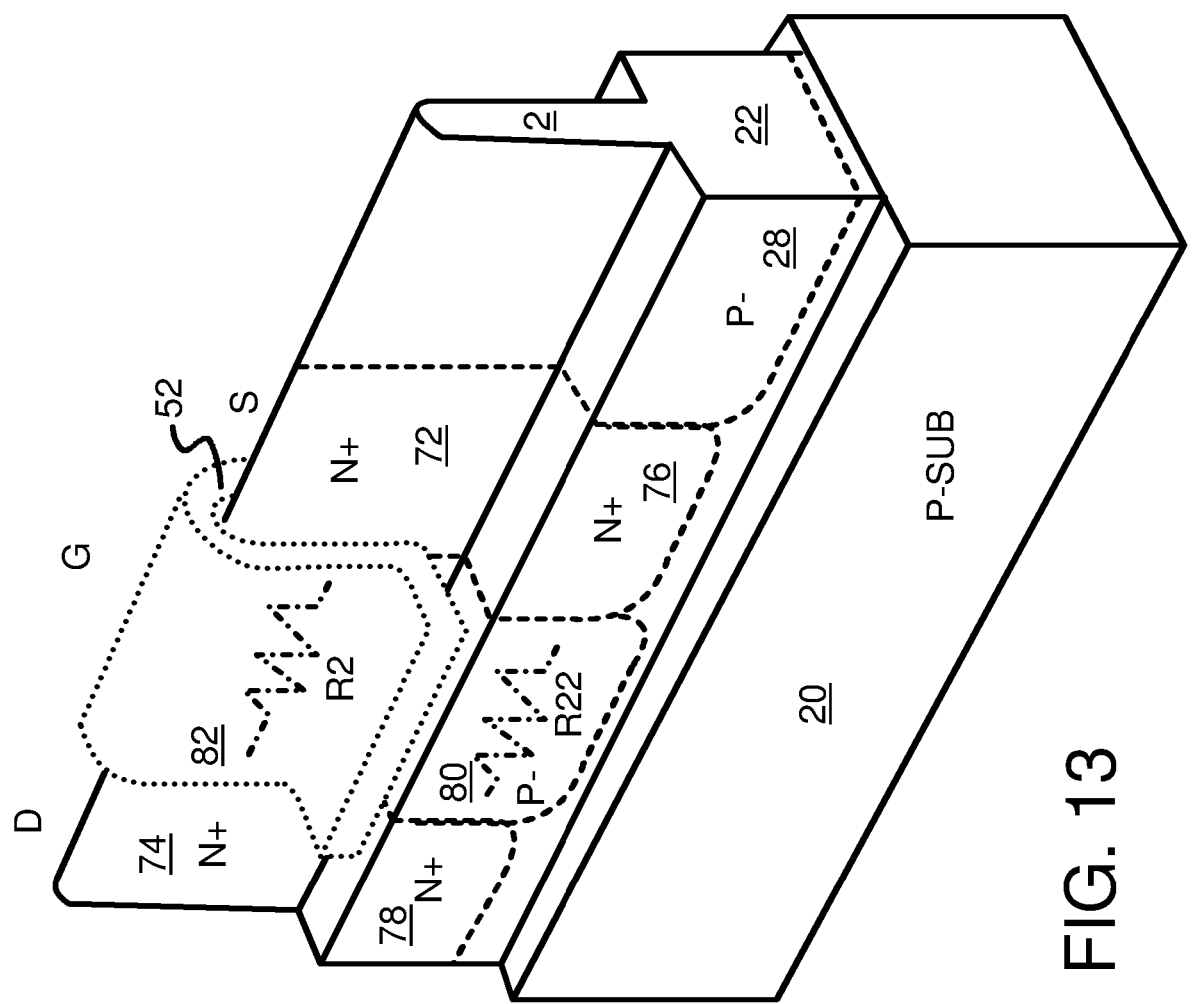
FIG. 13 shows an alternative stepped FinFET structure with a fin dopant added.

FIG. 13 shows an alternative stepped FinFET structure with a fin dopant added. A p-type dopant is added in a separate processing step. This p-type dopant has a lower concentration than used to form P+ tap region 66 (FIG. 10). P− region 28 is formed outside of source N+ region 72, drain N+ region 74, giving top slim fin 2 and bottom fin 22 a different p-type doping than for substrate 20. The p-type doping may be higher for P– region 28 than for substrate 20.

The p-type doping is applied before gate 52 is formed, so that buried conducting region 80 and conducting region 82 are p-doped. This p-type doping is particularly useful for lowering the resistances R22 and R2 under gate 52. This p-doping may already be present in a standard CMOS manufacturing process, since p-doping under gates is sometimes used to adjust transistor threshold voltages.

Figure 14:
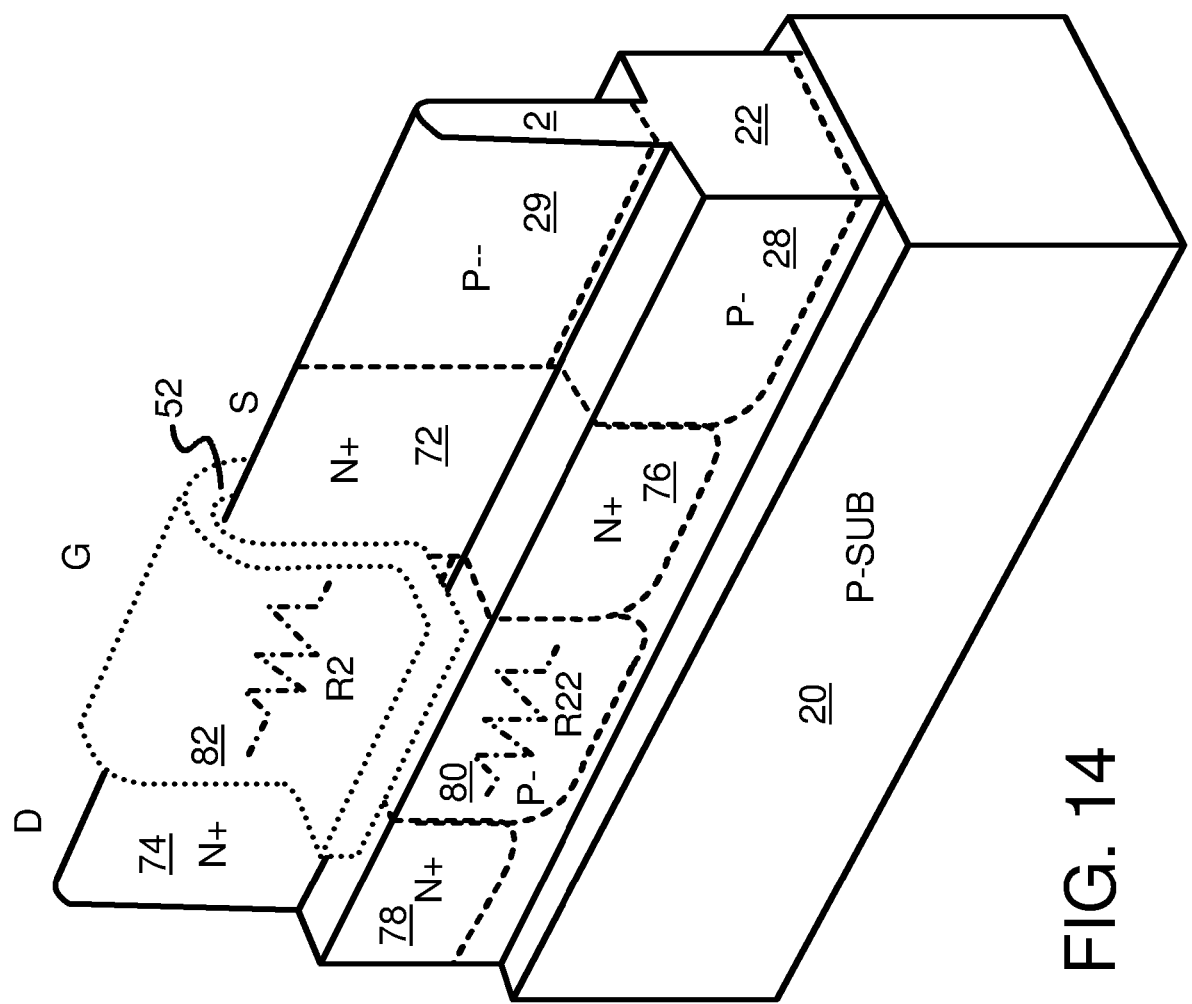
FIG. 14 is another alternative with separate doping of the top slim fin and the bottom fin under the gate.

FIG. 14 is another alternative with separate doping of the top slim fin and the bottom fin under the gate. In this variation, two p-type doping steps are used. A first p-type doping creates deep P– region 28 in bottom fin 22, while another p-type implant creates shallow P– region 29 in top slim fin 2. A deeper, higher energy implant sets the p-doping concentration in deep P– region 28 and for buried conducting region 80 and resistor R22, while a shallower, lower-energy implant sets the p-doping concentration in shallow P– region 29 and for conducting region 82 and resistor R2. Having two p-type regions 80, 82 under gate 52 allows for optimizing the FinFET for normal operation by adjusting the p-type doping for conducting region 82, while also optimizing the FinFET's deep punch-through conduction by adjusting the p-doping for buried conducting region 80.

For example, a higher p-doping concentration may be used for buried conducting region 80 than for conducting region 82, The higher deep doping causes R22 to have a lower resistance, thus allowing the FinFET to carry more ESD current when breakdown conducting occurs. The lower doping under gate 52 in conducting region 82 allows the FinFET's transistor characteristics such as threshold voltage and channel resistance to be optimized for normal operation when breakdown does not occur and conducting through R22 remains off.

Figure 15:
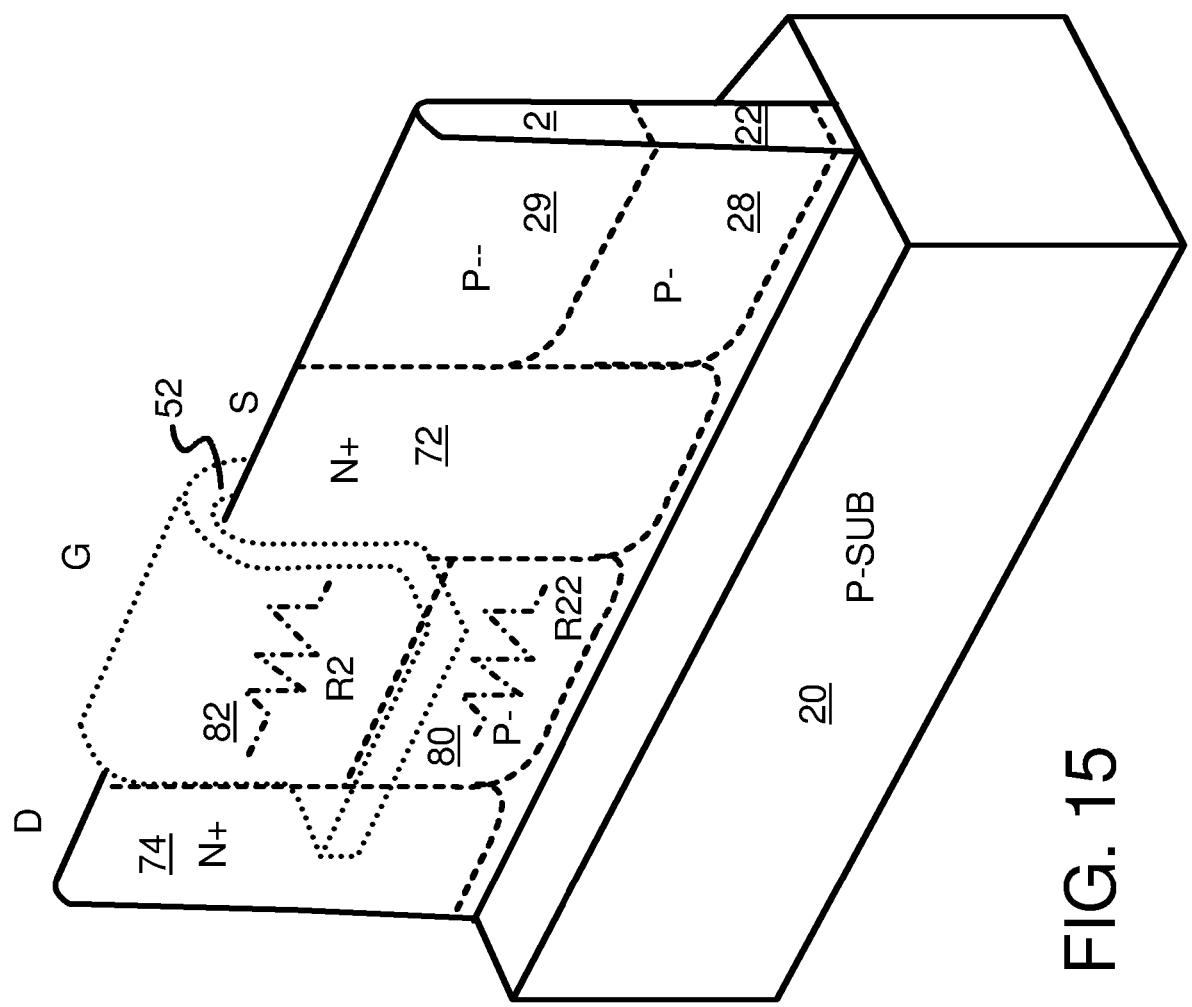
FIG. 15 shows a FinFET with a step in the doping profile.

FIG. 15 shows a FinFET with a step in the doping profile. Rather than have a step in the cross-sectional profile of top slim fin 2 and bottom fin 22, the step can be in the dopant profile.

The fin does not have two thicknesses in this variation. Instead, top slim fin 2 and bottom fin 22 have about the same thickness, although there may be a slant in the side wall so that bottom fin 22 is slightly thicker than top slim fin 2, However, not physical step of ledge is formed between top slim fin 2 and bottom fin 22.

Instead, gate 52 is formed to wrap around only the upper part of the fin, around top slim fin 2 but not around bottom fin 22. Shallow P– region 29 and conducting region 82 are doped to a first p-type concentration, while deep P– region 28 and buried conducting region 80 are doped to a second p-type concentration. Thus top slim fin 2 and bottom fin 22 are distinguished by different doping concentrations. The shallow doping concentration sets R2, while the deep p-type doping concentration sets R22. The location of the boundary between top slim fin 2 and bottom fin 22 may be about half of the overall fin height, or may be some other ratio. Thus a similar step effect is created by dopant profiles rather than by a physical step in the fin's cross-sectional profile.

Figure 16:
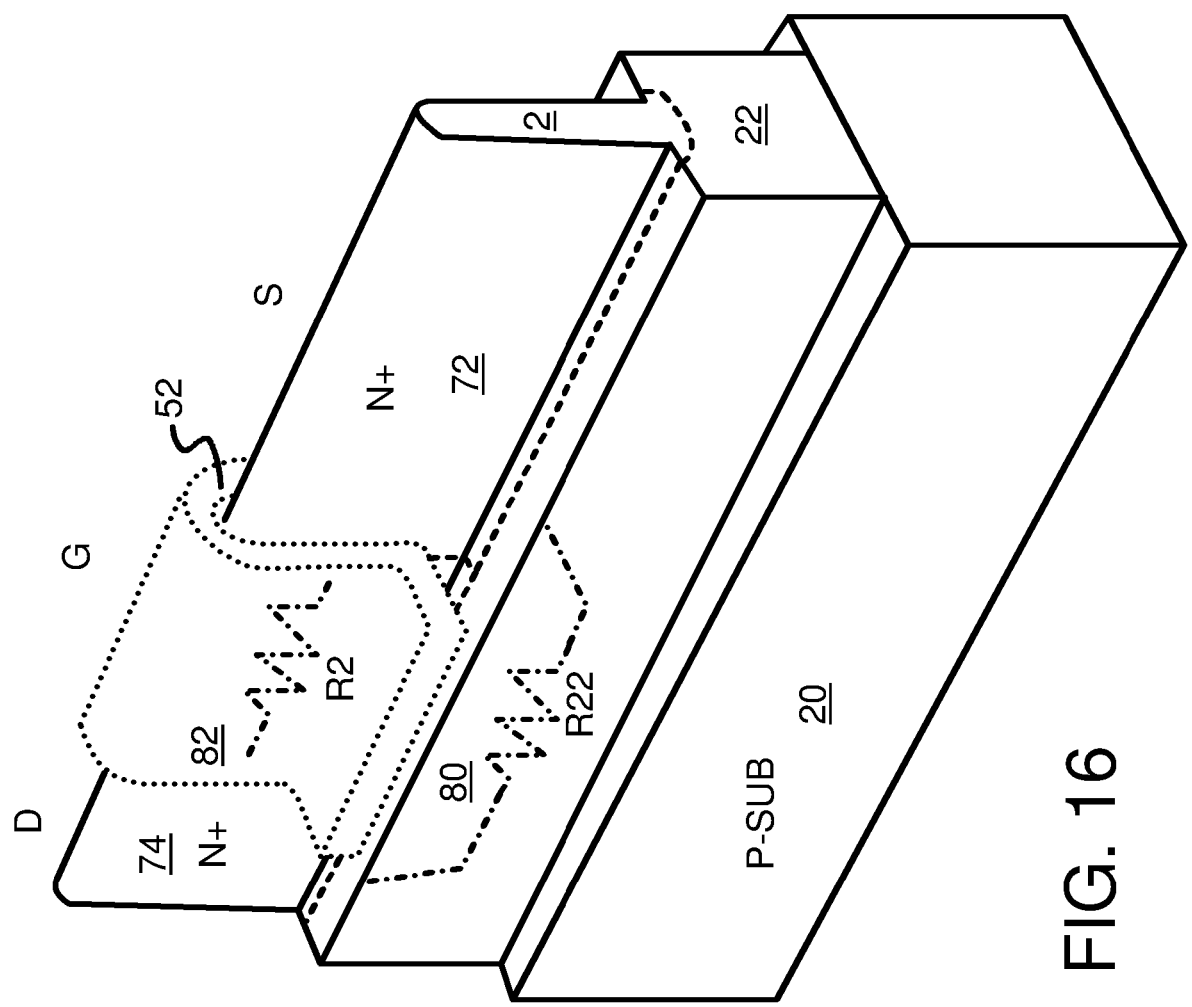
FIG. 16 shows a stepped FinFET with different dopings for the upper and lower portions of the fin.

FIG. 16 shows a stepped FinFET with different dopings for the upper and lower portions of the fin. A shallow p-type doping sets the p-type doping concentration for conducting region 82 under gate 52, while the p-type doping for buried conducting region 80 in bottom fin 22 is the same as for substrate 20. Thus the deep conduction for ESD through R22 is set by the substrate doping while the channel conduction during normal operation in conducting region 82 is set by the shallow p-type implant.

This embodiment also shows only shallow source/drains, not deep source/drains. Source N+ region 72 and drain N+ region 74 are formed in top slim fin 2, but the n-type source/drain implant is not deep enough to form source drains in bottom fin 22. However, source N+ region 72, drain N+ region 74 may extend slightly into bottom fin 22 as shown.

ALTERNATE EMBODIMENTS

Several other embodiments are contemplated by the inventors. For example, various materials may be used. Substrate 20 may be silicon, or may be silicon-germanium, or other compounds such as Ga—As and may have various dopants added. Likewise, top slim fin 2 and bottom fin 22 may be made from the same material as substrate 20, or may be a different material such as SiGe, and may have different dopants in different concentrations or profiles. Although the dopant concentration tends to vary within a region, the dopant concentration may still be considered to be relatively constant when compared with the rapid change in dopant concentration near region boundaries. Source/drain N+ doping can have a high concentration such as $10^{20}/cm^3$, while channel doping can have a low concentration, such as $10^{17}/cm^3$. Substrate doping could have an even lower concentration, such as $10^{15}/cm^3$. Typically, channel doping can be in the range of $10^{16}/cm^3$ to $10^{18}/cm^3$, while substrate doping can be in the range of $10^{14}/cm^3$ to $10^{16}/cm^3$, although other values are possible.

The resistance values R2 for normal channel conduction and for punch-through breakdown are different, and likely vary with applied voltage, but are shown as a single value R2 for simplicity. The exact values of R2 and R22 are complex and depend on bias conditions that vary during an ESD event, but are shown as simple resistors to illustrate the basic concept of current shunting by the larger or more highly doped bottom fin 22.

The substrate is substantially planar although there may be variations of its upper surface due to features being etched into the top surface. The fin structure is substantially perpendicular to the planar surface of the substrate. The fin's sidewalls can be slopped somewhat, perhaps being within 20 degrees of perpendicular to the substrate's generally planar surface. The centerline between the two sidewalls can be nearly perpendicular, such as no more than 20 degrees from being perpendicular to the plane of the substrate.

The cross-sectional area of the bottom portion of the fin is at least double the cross-sectional area of the top portion of the fin, and preferably at least three times the area. This area ratio causes the resistance ratios to be 1:2 or 1:3, with double or triple the current through the bottom portion of the fin than through the top portion of the fin. The doping of the buried conducting region can be the same as the doping of the conducting region when the bottom fin is 2-3 times the area or width of the top slim fin. Alternatively, the doping of the buried conducting region can be 2-3 times the doping of the conducting region when the bottom fin is about the same cross-sectional area or width of the top slim fin. Both a higher doping for buried conducting region and a larger cross-sectional area for bottom fin 22 may be used.

The semiconductor process used to manufacture the FinFET may have several variations. The VDD power supply voltage may be 1.8 volt or some other value, while the gate oxide breakdown voltage may be 6 volts, and the punch-through breakdown voltage that allows conduction through buried conducting region 80 may be about 3.7 volts, but these values may vary with processing, layout, temperature, and other conditions.

Many variations of trigger circuits are possible to enable the FinFET transistor being used for ESD/EOS protection. The width of a trigger pulse generated may be adjusted by varying the R-C time constant of a trigger circuit, or by adding delay elements such as strings of inverters.

The alternatives may be combined in various ways, or used separately or in other combinations. While n-channel FinFET complementary metal-oxide-semiconductor (CMOS) transistors have been described, other kinds of transistors could be substituted for some embodiments, such as n-channel only, p-channel only, or various alternate transistor technologies such as Bipolar or BiCMOS.

While descriptions of current flows and operations have been presented, these are theoretical and the theories may be incomplete or even incorrect. Regardless of the physical mechanisms and theoretical interpretations, the structure does offer protection from ESD pulses. Especially for small devices, currents may flow in unusual ways and using mechanisms that have not yet been thoroughly researched and understood.

Cutouts in diffusion and other regions may be used. Other shapes and physical layouts may be substituted, such as intermingled fingers. Fins could intersect other fins, bend, or have various macro geometries and layouts.

Devices may be implemented using n-channel, p-channel, or bipolar transistors, or junctions within these transistors. A capacitor could be attached to a resistance to provide an R-C time delay, or more complex circuits such as active triggering circuits may be added. In some embodiments, high-voltage transistors may be used rather than low-voltage transistors with appropriate bias conditions. The gate lengths and spacings can be increased to provide better protection from damage.

Different transistor, capacitor, resistor, and other device sizes can be used, and various layout arrangements can be used, such as multi-leg, ring, doughnut or irregular-shape transistors. Additional taps, guard rings, transistors, and other components may be added. The power node could be a common-discharge line (CDL) that normally floats rather than a power line. There can be several internal nodes that connect to different input or output pads. The input/output pads may be connected to an input buffer, test-scan logic, and other circuits. More than one power supply may be used.

P and N wells could be formed in substrate 20, and either used under the FinFET transistor when the FinFET transistors can be p-type or n-type. Some embodiments may use an additional deep N+ or P+ implant region, or the location and depth of implant regions may be shifted. The final profiles and shapes of various layers may differ depending on the process used. In particular, deeper layers may shift around relative to the mask layouts. Also, the mask edges and final processed boundaries may differ with process steps.

Guard rings may be added that are continuous, or have openings or cutouts for various reasons. The P+ guard ring and an N+ guard ring may be electrically connected together and left floating, or connected to a fixed voltage such as the power supply or ground, or may be connected to different voltages, such as connecting a P+ guard ring to ground and an N+ guard ring to the power supply. The voltage biases to the P+ guard ring and to the N+ guard ring may be actively switched, or muxed for various modes and conditions of operation.

Additional leaker devices such as resistors and small transistors could be added. Parasitic capacitances and resistances may be used from some components, depending on the process and device sizes used.

The ESD-protection circuit can be combined with other input-protection circuits, such as a power clamp circuit, other pad protection circuits, or a series-resistor protection circuit to the gate of an input buffer. Grounded-gate and thick oxide protection transistors and diodes can also be added at various points to increase ESD protection. One, two, of four ESD structures could be added to each I/O pin, or just to input pins.

Both thick oxide and thin oxide transistors may be protected by a power clamp and ESD protection devices. Alternately, several power clamps with different combinations of transistors and power-supply voltages may be used. Each pad may have only one ESD protection device, only two ESD protection devices, or four ESD protection devices. The anode and cathode (A and K) nodes may be reversed to swap the direction of protection.

Bias, VDD, and voltage values may vary somewhat due to process, temperature, and design variances. For example, the forward bias voltage may be 0.5 volt, +/−0.1 volt, the trigger voltage may be 4 volts, +/−0.5 volts, and the holding voltage may be 2 volts+/−0.5 volts. Other values are possible.

The snap-back breakdown voltage of a triggering transistor may vary somewhat from low-voltage transistors in core circuitry. For example, a triggering transistor may have a slightly longer channel length or other features to harden it, while low-voltage transistors in core circuitry may use minimum channel lengths and dimensions. Snap-back voltages may vary with process, temperature, and exact geometries of the transistors.

While descriptions of operation have been given based on a theoretical understanding of the physical processes, these theoretical descriptions may be incorrect. Second and third order effects may also be present. Various mechanisms may be responsible for breakdown and conduction under various conditions.

Large output driver transistors also act as large diodes for some ESD tests and conditions. For example, when the ESD pulse is applied across an I/O pad and the power-supply pad, a positive ESD pulse can turn on a parasitic p-n drain-substrate junction of the drain of the large p-channel driver transistor. The n-type substrate or well of the p-channel driver transistor is normally connected to the I/O power supply. Thus the p-n junction is forward biased by the positive ESD pulse. While output pads have been described, other connection technologies may be substituted, such as ball-grid-array (BGA), flip-chip, etc., and the term pads is considered to apply to all such balls, pads, landings, etc. that are for external connection.

Likewise, when the ESD pulse is applied across the I/O pad and the ground pad, a negative ESD pulse can turn on the parasitic n-p drain-substrate junction of the drain of the large n-channel driver transistor. The p-type substrate or well of the n-channel driver transistor is normally connected to the I/O ground. Thus the p-n junction is forward biased by the negative ESD pulse. Various cross-domain coupling paths and mechanisms may exist that couple ESD pulses applied to one power-supply domain to another power-supply domain.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A Fin Field-Effect Transistor (FinFET) Electro-Static-Discharge (ESD) protection device comprising:
   a substrate having a substantially planar surface;
   a fin formed on the substrate, the fin being of a semiconductor material and having a cross-sectional shape;
   a gate formed around a top portion of the fin, the gate covering a top surface of the fin and wrapping around the top portion of two sidewalls of the fin;
   a conducting region in the top portion of the fin, the conducting region being covered by the gate;
   a gate oxide formed between the gate and the conducting region, the gate oxide being formed over the conducting region on the top portion of the fin including the top surface and the top portion of the two sidewalls, wherein the gate is non-planar;
   a source region in the top portion of the fin, and adjacent to the conducting region, the source region having a first concentration of a first dopant;
   a drain region in the top portion of the fin, and adjacent to the conducting region, the drain region having the first concentration of the first dopant;
   wherein the conducting region has a second dopant having an opposite polarity type as the first dopant;
   wherein a current conduction between the drain region and the source region through the conducting region has a first effective resistance;
   a buried conducting region in a bottom portion of the fin, the buried conducting region being underneath the conducting region;
   a buried source region in the bottom portion of the fin, and adjacent to the buried conducting region, the buried source region having a second concentration of the first dopant;
   a buried drain region in the bottom portion of the fin, and adjacent to the buried conducting region, the buried drain region having the second concentration of the first dopant;
   wherein a current conduction between the buried drain region and the buried source region through the buried conducting region has a second effective resistance;
   wherein a normal current conduction between the source region and the drain region through the conducting region is controlled by a gate voltage applied to the gate during normal operation;
   wherein during normal operation the gate voltage and a voltage between the source region and the drain region are less than a breakdown voltage;
   wherein current conduction between the buried drain region and the buried source region through the buried conducting region does not occur during normal operation when applied voltages are less than the breakdown voltage;
   wherein the first effective resistance is at least double the second effective resistance when the voltage between the source region and the drain region is more than the breakdown voltage,
   wherein a breakdown current through the buried conducting region is at least double the breakdown current through the conducting region during an ESD event.

2. The FinFET ESD protection device of claim 1 further comprising:
   a step between the top portion of the fin and the bottom portion of the fin, the step being a change in concentration of the second dopant between the conducting region in the top portion of the fin and the buried conducting region in the bottom portion of the fin;
   wherein a concentration of the second dopant in the buried conducting region is at least double a concentration of the second dopant in the conducting region;
   wherein the fin has a cross-sectional shape having a height that is at least double an average width of the cross-sectional shape.

3. The FinFET ESD protection device of claim 1 further comprising:
   wherein the fin has a cross-sectional shape having a height that is at least double an average width of the cross-sectional shape;
   a step between the top portion of the fin and the bottom portion of the fin, the step being a ledge in one of the two sidewalls of the fin, the ledge being within 40 degrees of parallel to the planar surface of the substrate;
   wherein the gate wraps over the two sidewalls of the top portion of the fin but does not wrap over the two sidewalls in the bottom portion of the fin.

4. The FinFET ESD protection device of claim 3 wherein the cross-sectional shape has a top portion above a level of the ledge and a bottom portion below the level of the ledge;
   wherein an area of the bottom portion of the cross-sectional shape is at least double an area of the top portion of the cross-sectional shape,
   whereby breakdown current passes through a larger cross-sectional area of the bottom portion of the fin than for the top portion of the fin.

5. The FinFET ESD protection device of claim 4 wherein the gate extends over the ledge, wherein the gate blocks the first dopant from being implanted into the buried conducting region during manufacture, wherein the buried conducting region has the second dopant having the opposite polarity type as the first dopant, wherein the gate extending over the ledge shadows the buried conducting region during ion implantation.

6. The FinFET ESD protection device of claim 1 further comprising:

a step between the top portion of the fin and the bottom portion of the fin, the step being an abrupt change in slope of one of the two sidewalls or the step being a flat surface bisecting a sidewall;

wherein the sidewall has the step formed within a middle third of a height of the sidewall;

wherein an average width of the bottom portion of the fin below the step is wider than an average width of the top portion of the fin above the step by at least double;

wherein the fin has a cross-sectional shape having a height that is at least double an average width of the cross-sectional shape;

wherein the cross-sectional shape of the bottom portion of the fin is rectangular, trapezoidal, triangular, or curved.

7. The FinFET ESD protection device of claim 4 further comprising:

a tap region in the top portion of the fin and in the bottom portion of the fin, the tap region having a third concentration of the second dopant.

8. The FinFET ESD protection device of claim 4 wherein a concentration of the second dopant in the conducting region in the top portion of the fin is a same concentration as a concentration of the second dopant in the buried conducting region in the bottom portion of the fin;

wherein the first concentration and the second concentration are at least ten times the concentration of the second dopant in the conducting region;

wherein an area of the bottom portion of the cross-sectional shape is at least triple an area of the top portion of the cross-sectional shape.

9. The FinFET ESD protection device of claim 4 wherein a concentration of the second dopant in the conducting region in the top portion of the fin is a lower concentration than a concentration of the second dopant in the buried conducting region in the bottom portion of the fin;

wherein a concentration of the second dopant in the buried conducting region is at least double a concentration of the second dopant in the conducting region.

* * * * *